(12) United States Patent
Motoki et al.

(10) Patent No.: US 9,379,685 B2
(45) Date of Patent: Jun. 28, 2016

(54) BUILT-IN-CIRCUIT SUBSTRATE AND COMPOSITE MODULE

(71) Applicant: Murata Manufacturing Co., Ltd., Nagaokakyo-shi, Kyoto-fu (JP)

(72) Inventors: Kanta Motoki, Nagaokakyo (JP); Sayyed Tabib, Nagaokakyo (JP); Saneaki Ariumi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/661,181

(22) Filed: Mar. 18, 2015

(65) Prior Publication Data

US 2015/0194943 A1    Jul. 9, 2015

Related U.S. Application Data

(63) Continuation of application No. PCT/JP2013/072058, filed on Aug. 19, 2013.

(30) Foreign Application Priority Data

Sep. 19, 2012    (JP) .................................. 2012-205176

(51) Int. Cl.
*H03H 7/01* (2006.01)
*H05K 1/02* (2006.01)
(Continued)

(52) U.S. Cl.
CPC ............... *H03H 7/0138* (2013.01); *H01G 4/40* (2013.01); *H03H 7/0115* (2013.01); *H05K 1/0233* (2013.01); *H03H 2001/0085* (2013.01); *H05K 1/162* (2013.01); *H05K 1/165* (2013.01); *H05K 1/181* (2013.01); *H05K 3/403* (2013.01); *H05K 2201/083* (2013.01)

(58) Field of Classification Search
CPC .................... H03H 2001/0085; H03H 7/0161; H03H 7/0115; H03H 7/0138; H03H 1/0233
USPC .......................................... 333/175, 185, 181
See application file for complete search history.

(56) References Cited

U.S. PATENT DOCUMENTS

| 4,888,569 A | 12/1989 | Nicholson et al. |
| 5,465,417 A | 11/1995 | Tanbakuchi |

(Continued)

FOREIGN PATENT DOCUMENTS

| JP | 1-167704 U | 11/1989 |
| JP | 02-23701 A | 1/1990 |

(Continued)

OTHER PUBLICATIONS

Official Communication issued in International Patent Application No. PCT/JP2013/072058, mailed on Sep. 10, 2013.

*Primary Examiner* — Robert Pascal
*Assistant Examiner* — Rakesh Patel
(74) *Attorney, Agent, or Firm* — Keating & Bennett, LLP

(57) ABSTRACT

A built-in-circuit substrate includes a substrate body, an electrical circuit including inner electrodes provided inside the substrate body and to which an RF signal is input, outer electrodes which are provided on the substrate body so as to be connected to the electrical circuit and which each include an underlying metal layer and a nickel layer covering at least a portion of the underlying metal layer, and a permanent magnet which is arranged on the substrate body. Thus, noise caused by intermodulation distortion generated in the nickel layers of the outer electrodes is prevented.

19 Claims, 4 Drawing Sheets

(51) Int. Cl.
*H01G 4/40* (2006.01)
*H03H 1/00* (2006.01)
*H05K 1/16* (2006.01)
*H05K 1/18* (2006.01)
*H05K 3/40* (2006.01)

(56) References Cited

U.S. PATENT DOCUMENTS

| | | | |
|---|---|---|---|
| 5,510,756 | A | 4/1996 | Arnold et al. |
| 2002/0145496 | A1 | 10/2002 | Hasegawa |
| 2003/0030994 | A1 | 2/2003 | Takaya et al. |
| 2004/0183630 | A1 | 9/2004 | Tanne et al. |
| 2007/0159270 | A1 | 7/2007 | Sunwoo et al. |
| 2007/0242416 | A1 | 10/2007 | Saito et al. |
| 2009/0174501 | A1 | 7/2009 | Parsche et al. |
| 2010/0283557 | A1* | 11/2010 | Taniguchi ............ 333/204 |
| 2011/0037529 | A1* | 2/2011 | Kishimoto ........ H01P 1/387 333/24.2 |

FOREIGN PATENT DOCUMENTS

| | | |
|---|---|---|
| JP | 02-66004 A | 3/1990 |
| JP | 4-76723 U | 7/1992 |
| JP | 05-63486 A | 3/1993 |
| JP | 05-175710 A | 7/1993 |
| JP | 05-191108 A | 7/1993 |
| JP | 07-30308 A | 1/1995 |
| JP | 07-202517 A | 8/1995 |
| JP | 07-234255 A | 9/1995 |
| JP | 07-263907 A | 10/1995 |
| JP | 09-190924 A | 7/1997 |
| JP | 09-232814 A | 9/1997 |
| JP | 09-306605 A | 11/1997 |
| JP | 10-242714 A | 9/1998 |
| JP | 11-67540 A | 3/1999 |
| JP | 2000-286124 A | 10/2000 |
| JP | 2002-158135 A | 5/2002 |
| JP | 2002-170714 A | 6/2002 |
| JP | 2002-204107 A | 7/2002 |
| JP | 2002-314305 A | 10/2002 |
| JP | 2003-229704 A | 8/2003 |
| JP | 2003-229841 A | 8/2003 |
| JP | 2004-537905 A | 12/2004 |
| JP | 2005-277364 A | 10/2005 |
| JP | 2007-189686 A | 7/2007 |
| JP | 2007-281400 A | 10/2007 |
| JP | 2009-58936 A | 3/2009 |
| JP | 2009-147490 A | 7/2009 |
| JP | 2010-273000 A | 12/2010 |
| JP | 2011-510489 A | 3/2011 |

* cited by examiner

BUILT-IN-CIRCUIT SUBSTRATE AND COMPOSITE MODULE

BACKGROUND OF THE INVENTION

1. Field of the Invention

The present invention relates to a built-in-circuit substrate including an electrical circuit which has been built in and configured to receive an RF signal, and relates to a composite module which includes the built-in-circuit substrate.

2. Description of the Related Art

A known ceramic electronic component 100 includes an inner electrode 102 that is formed inside a ceramic multilayer body 101; and an outer electrode 103 for an external connection that is formed on a surface of the ceramic multilayer body 101, as illustrated in an example of an electronic component of FIG. 6 (Japanese Unexamined Patent Application Publication No. 2007-281400). The outer electrode 103 of such a ceramic electronic component 100 is mainly formed of an underlying metal layer 104 including Cu or the like that is formed on a surface of the ceramic multilayer body 101; a nickel (Ni) layer 105 that covers the underlying metal layer 104; and a tin (Sn) layer 106 that covers the Ni layer. In this case, the Ni layer 105 is provided as a layer having little diffusion to the underlying metal layer 104, and the Sn layer 106 is provided as a layer for improving wetability of solder when the ceramic electronic component 100 is connected, for example, to a mother substrate or the like with solder.

Inside the above-described electronic component 100, there is a built-in-circuit substrate in which a filter circuit or the like, which is formed of a capacitor element and an inductor element, is formed in the ceramic multilayer body 101, for example. In the case where such a built-in-circuit substrate is installed in an electronic appliance that uses a high-frequency signal (RF signal) such as a cellular phone, the RF signal flows to an outer electrode formed on the built-in-circuit substrate.

In such a manner, when an RF signal flows to an outer electrode, the RF signal attempts to flow to the Sn layer, which is the outermost layer of the outer electrode, due to the skin effect. However, because the Sn layer is generally formed so as to be thin, there is a case in which the RF signal flows into the Ni layer positioned below the Sn layer.

The Ni layer, which is formed of a magnetic material (ferromagnetic material), has a magnetic flux density-magnetic field strength characteristic (B-H characteristic) that is expressed by a magnetic hysteresis curve as illustrated in FIG. 7. Here, a region R1 in which the magnetic flux density is saturated with respect to magnetic field strength and a non-saturation region R2 other than that region exist. When an RF signal flows into the non-saturation region R2, particularly in the case where a plurality of RF signals having different frequencies is simultaneously input, intermodulation distortion (IMD) is generated.

Therefore, as described above, in the case where the built-in-circuit substrate is used in a communication system in which a plurality of RF signals having different frequencies is simultaneously used, there is a risk that communication characteristics are degraded by noise generated from the built-in-circuit substrate, and therefore, a technology is demanded for preventing generation of noise caused by intermodulation distortion.

SUMMARY OF THE INVENTION

Preferred embodiments of the present invention provide a built-in-circuit substrate that prevents noise caused by intermodulation distortion and provide a composite module that includes the built-in-circuit substrate.

A built-in-circuit substrate according to a preferred embodiment of the present invention includes a substrate body; an electrical circuit including an inner electrode provided inside the substrate body and configured to receive an RF signal; an outer electrode that is provided on the substrate body so as to be connected to the electrical circuit and that includes an underlying metal layer and a nickel layer covering at least a portion of the underlying metal layer; and a magnet that is arranged on the substrate body.

With this configuration, an external magnetic field that magnetizes the Ni layer of the outer electrode to the saturation region of magnetic flux density on a magnetic hysteresis curve of the Ni layer is applied by the magnet arranged on the substrate body. Therefore, even in a case where an RF signal flows to the Ni layer, intermodulation distortion is not generated and noise caused by intermodulation distortion generated in the outer electrode of the built-in-circuit substrate is prevented.

In addition, it is preferable that the magnet be close to the outer electrode. With this configuration, the external magnetic field that magnetizes the Ni layer of the outer electrode to the saturation region of magnetic flux density is efficiently applied by the magnet, such that the degree of freedom in selecting the magnet to be arranged on the substrate body is improved.

In addition, the magnet preferably is arranged on one main surface or another main surface of the substrate body. With this configuration, the external magnetic field that magnetizes the Ni layer of the outer electrode to the saturation region of magnetic flux density is applied by the magnet, such that noise caused by intermodulation distortion generated in the outer electrode of the built-in-circuit substrate is prevented.

In addition, a concavity preferably is provided in the one main surface or the other main surface of the substrate body and the magnet preferably is arranged in the concavity. With this configuration, the height of the magnet from the main surface of the substrate body is reduced, and therefore, a reduction in the profile of the built-in-circuit substrate is achieved.

In addition, the magnet may be arranged on a side surface, which is a surface of the substrate body other than the one main surface or the other main surface. With this configuration, the height of the magnet from the main surface of the substrate body is reduced, and therefore, a reduction in the profile of the built-in-circuit substrate is achieved.

In addition, the electrical circuit preferably is a filter circuit. With this configuration, preferred embodiments of the present invention are applied to a built-in-circuit substrate including a built-in filter circuit.

In addition, a composite module according to yet another preferred embodiment of the present invention includes any one of the above-described built-in-circuit substrates; and an electronic component mounted on the one main surface of the substrate body.

With this configuration, a composite module including a built-in-circuit substrate that prevents generation of noise caused by intermodulation distortion is provided. In addition, when the Ni layer is provided on a terminal electrode of an electronic component, noise caused by intermodulation distortion generated on the side of the electronic component is also prevented.

In addition, a composite module preferably includes an electronic component that is mounted on the one main surface of the substrate body of the built-in-circuit substrate including a magnet arranged on the one main surface of the substrate body or including a concavity provided in the one main surface of the substrate body and the magnet arranged in the concavity, in which the magnet preferably is arranged so as to surround the electronic component on the one main surface side of the substrate body.

With this configuration, noise caused by intermodulation distortion generated on the side of the electronic component is efficiently prevented. In addition, in the case where the magnet is arranged so as to surround the electronic component on the one main surface (without providing the concavity) of the substrate body, the electronic component is protected by the magnet, and therefore, the electronic component is prevented from being damaged by external impacts.

According to various preferred embodiments of the present invention, an external magnetic field that magnetizes an Ni layer of an outer electrode provided on a substrate body to a saturation region of magnetic flux density on a magnetic hysteresis curve of the Ni layer is applied by a magnet arranged on the substrate body, and therefore, noise caused by intermodulation distortion generated in the Ni layer of the outer electrode is prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
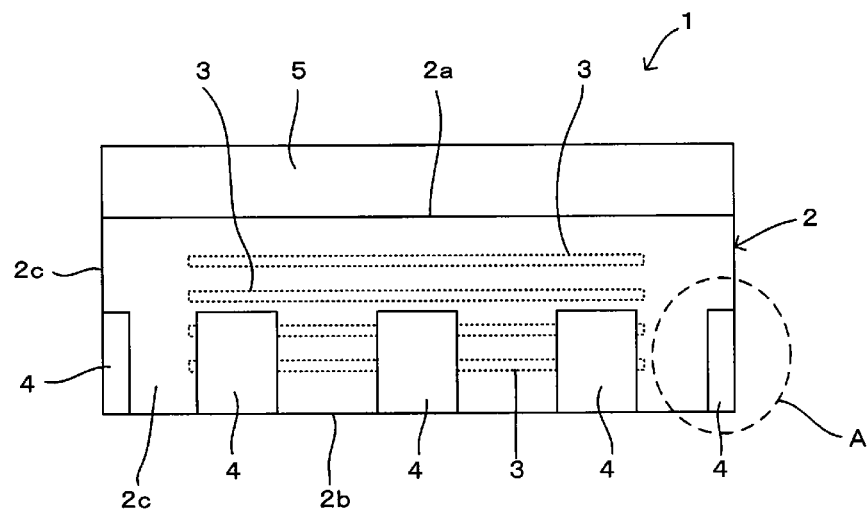
FIG. 1 is a front view of a built-in-circuit substrate according to a first preferred embodiment of the present invention.
Figure 2:
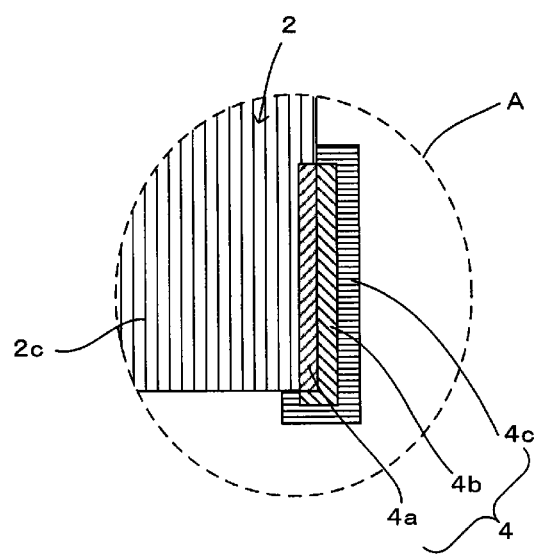
FIG. 2 is an enlarged sectional view of region A in FIG. 1.

A built-in-circuit substrate 1 according to a preferred embodiment of the present invention is described with reference to FIG. 1 and FIG. 2. FIG. 1 is a front view of the built-in-circuit substrate 1, and FIG. 2 is an enlarged sectional view of region A in FIG. 1 and illustrates a layer structure of an outer electrode.

The built-in-circuit substrate 1 according to the present preferred embodiment, as illustrated in FIG. 1, includes a substrate body 2, an electrical circuit including inner electrodes 3 provided inside the substrate body 2 and to which a high frequency signal (RF signal) is input, outer electrodes 4 that are provided on the substrate body 2 so as to be connected to the electrical circuit, and a permanent magnet 5 (corresponding to a magnet of a preferred embodiment of the present invention) that is arranged on one main surface 2a of the substrate body 2. The built-in-circuit substrate 1 preferably is, for example, installed on a mother substrate of an electronic appliance such as a cellular phone in which RF signals are used. In the present preferred embodiment, a filter circuit, which is one example of an electrical circuit, is defined by the inner electrodes 3 of the substrate body 2.

The substrate body 2 is preferably made from, for example, a low temperature co-fired ceramic (LTCC) multilayer substrate, a glass epoxy resin multilayer substrate, or the like, and the inner electrodes 3, via conductors (not illustrated), and so forth are provided inside the substrate body 2. Capacitor elements and inductor elements are defined by the inner electrodes 3 and via conductors, which are composed of a conductive material such as Cu, provided inside the substrate body 2, and the filter circuit is defined by these elements.

The electrical circuit provided in the substrate body 2 is not limited to a filter circuit, and may be, for example, an amplifier circuit or a branching circuit (diplexer) defined by a combination of a plurality of filter circuits. In addition, the filter circuit is not necessarily defined only by the inner electrodes 3, and may have a configuration in which, for example, chip capacitors and the like are mounted on the substrate body 2, and the capacitor elements and inductor elements defined by the inner electrodes 3 and the chip capacitors are used in combination to form the filter circuit. In addition, the substrate body 2 does not necessarily have a multilayer structure.

The substrate body 2 is manufactured preferably by dividing an agglomerate of a plurality of substrate bodies 2 into individual units. At this time, in the case where the substrate body 2 is an LTCC multilayer substrate, for example, a non-limiting example of a manufacturing method thereof includes forming ceramic green sheets by forming a slurry obtained by mixing a mixed powder of alumina, glass, and the like with an organic binder, a solvent and so forth into sheets; forming via holes at certain positions in the ceramic green sheets by performing laser processing; forming via conductors for interlayer connection by filling thus-formed via holes with a conductive paste containing Ag, Cu or the like, and forming various inner electrodes 3 by printing with a conductive paste. After that, an agglomerate of the substrate bodies 2 is manufactured by stacking the ceramic green sheets on top of one another and performing press bonding to form a ceramic multilayer body, and then subjecting thus-formed ceramic multilayer body to firing at a low temperature of around 1000° C., that is, to low temperature firing. The built-in-circuit substrate 1 is manufactured by dividing the thus-manufactured agglomerate of substrate bodies 2 into individual substrate bodies 2 by performing dicing with a dicing saw, and forming the outer electrodes 4 described later on side surfaces 2c, which are surfaces of the substrate body 2 other than the one main surface 2a and another main surface 2b, and arranging the permanent magnet 5 on the one main surface 2a of the substrate body 2.

The outer electrodes 4 are electrodes configured to provide connection of the built-in-circuit substrate 1 to an external mother substrate, for example, and as illustrated in FIG. 2, each include a Cu layer 4a (corresponding to an underlying metal layer of the present invention) provided on the side surface 2c of the substrate body 2, a Ni layer 4b that covers the Cu layer 4a and a Sn layer 4c that covers the Ni layer 4b. In addition, each of the layers 4a, 4b and 4c of each of outer electrodes 4 is preferably formed by plating, for example, and the outer electrodes 4 are connected to the filter circuit defined by the inner electrodes 3 of the substrate body 2.

The outer electrodes 4 preferably are provided on the other main surface 2b of the substrate body 2, and preferably include a configuration in which the outer electrodes 4 are provided on both the side surfaces 2c and the other main surface 2b of the substrate body 2. In addition, the Ni layer 4b, which covers the Cu layer 4a, does not necessarily cover the entirety of the Cu layer 4a and may be covered with the Ni layer 4b cover at least a portion of the Cu layer 4a.

The permanent magnet 5 applies an external magnetic field so that the Ni layer 4b of the outer electrode 4 is magnetized to the saturation region R1 of magnetic flux density on the magnetic hysteresis curve of the Ni layer 4b and is arranged on the one main surface 2a of the substrate body 2. At that time, the permanent magnet 5 is arranged on the substrate body 2 by adhering the solid permanent magnet 5 and the substrate body 2 to each other using an insulating adhesive. A permanent magnet 5, which is preferably formed by coating the substrate body 2 with a paste resin that contains a powdered magnet, curing the paste resin, and then, for example, subjecting the cured resin to grinding or the like, may be arranged on the substrate body 2. In addition, the shape of the permanent magnet 5 preferably is selected from among various shapes such as shapes having a rectangular shape, an L-shape, a square annular shape or an I shape in a plan view.

In addition, a ferrite magnet is one non-limiting example of the permanent magnet 5 to be used, but so long as the magnet is capable of applying an external magnetic field so that the Ni layer 4b of the outer electrode 4 is magnetized to the saturation region of magnetic flux density, any type of permanent magnet may be used. Furthermore, it is preferable that the permanent magnet 5 be arranged close to the outer electrodes 4 so that the external magnetic field is efficiently applied to the Ni layers 4b.

Figure 3A:
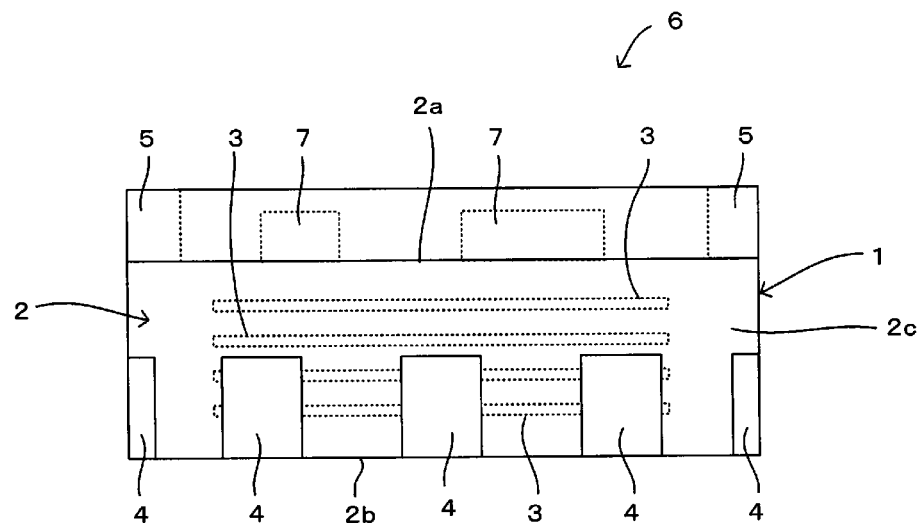
FIGS. 3A and 3B illustrates an example of a composite module that includes the built-in-circuit substrate of FIG. 1.

Next, a non-limiting example of a composite module 6 in which electronic components 7 are mounted on the built-in-circuit substrate 1 is described with reference to FIGS. 3A and 3B. FIG. 3A is a front view and FIG. 3B is a plan view of the composite module 6.

Figure 3B:
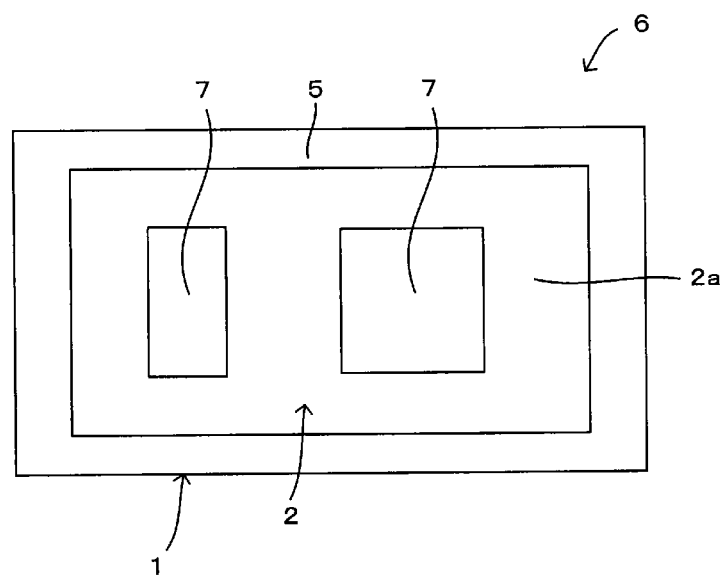

The composite module 6, as illustrated in FIGS. 3A and 3B, includes the built-in-circuit substrate 1 and the electronic components 7 such as an IC or a chip capacitor mounted on the one main surface 2a of the substrate body 2 of the built-in-circuit substrate 1, and is, for example, used as a switch module, a wireless LAN module or a Bluetooth (Registered Trademark) module, each of which includes a branching circuit (diplexer) in which a plurality of filter circuits is used in combination with each other, or a filter circuit, inside the substrate body 2.

At this time, in addition to the electrodes provided on the side surfaces 2c of the substrate body 2, the outer electrodes 4 are also provided on the one main surface 2a as mounting electrodes (not illustrated) to provide connection to the electronic components 7. In addition, the permanent magnet 5 included in the built-in-circuit substrate 1 preferably has a square annular shape in a plan view and is arranged so as to surround the electronic components 7 on a side of the one main surface 2a of the substrate body 2, as illustrated in FIG. 3B. The rest of the configurations are the same as those of the built-in-circuit substrate 1 described with reference to FIG. 1, and therefore, the same symbols are used and description thereof is omitted.

The permanent magnet 5 is not necessarily square annular shaped in a plan view and arranged so as to surround the entire peripheries of the electronic components 7, and, for example, the permanent magnet 5 may be L shaped or a U shaped when viewed in plan and be arranged so as to partially surround the electronic components 7. In addition, it is not necessary to form the above-described shapes with one permanent magnet 5, and for example, a configuration may be adopted in which a plurality of permanent magnets 5, each of which is rectangular parallelepiped or cuboid shaped, is combined to define the above-described shapes.

With the above-described configuration, the composite module 6 prevents noise caused intermodulation distortion generated in the outer electrodes 4 (Ni layers 4b) of the built-in-circuit substrate 1, and also prevents noise caused by intermodulation distortion generated on the side of the electronic components 7 in the case where, for example, Ni layers are provided on terminal electrodes of the electronic components 7.

In addition, by arranging the permanent magnet 5 so as to surround the electronic components 7 on the one main surface 2a of the substrate body 2, the external magnetic field generated by the permanent magnet 5 is efficiently applied to the terminal electrodes of the electronic components 7, and therefore, the effect of noise is further reduced or prevented. In addition, since the electronic components 7 are protected by the permanent magnet 5, the electronic components 7 are prevented from being damaged by external impacts and the like.

Therefore, according to the above-described preferred embodiment, by arranging the permanent magnet 5 on the one main surface 2a of the substrate body 2, the external magnetic field is applied so that the Ni layer 4b of the outer electrode 4 is magnetized to the saturation region of magnetic flux density, and therefore, even in the case where an RF signal flows to the Ni layers 4b, intermodulation distortion is not generated and noise caused by intermodulation distortion generated in the outer electrodes 4 of the built-in-circuit substrate 1 is prevented.

In addition, when the permanent magnet 5 is arranged close to the outer electrodes 4, the external magnetic field is efficiently applied to the Ni layers 4b of the outer electrodes 4, and therefore, the degree of freedom in selecting the permanent magnet 5 to be arranged on the substrate body 2 is improved.

Second Preferred Embodiment

Figure 4:
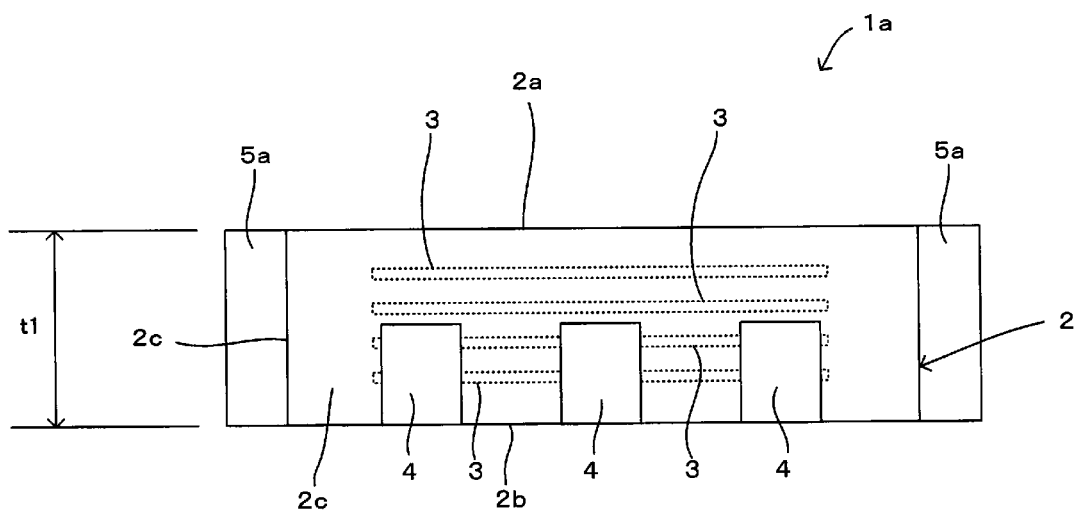
FIG. 4 is a front view of a built-in-circuit substrate according to a second preferred embodiment of the present invention.

A built-in-circuit substrate 1a according to a second preferred embodiment of the present invention is described with reference to FIG. 4. FIG. 4 is a front view of the built-in-circuit substrate 1a.

The built-in-circuit substrate 1a according to the second preferred embodiment differs from the built-in-circuit substrate 1 of the first preferred embodiment described with reference to FIG. 1 in that permanent magnets 5a are preferably arranged on side surfaces 2c, which are surfaces of the substrate body 2 other than the one main surface 2a and the other main surface 2b, as illustrated in FIG. 4. The rest of the configurations are preferably the same as those of the built-in-circuit substrate 1 of the first preferred embodiment, and therefore, the same symbols are used and description thereof is omitted.

In this case, in contrast to the permanent magnet 5 being arranged on the one main surface 2a of the substrate body in the built-in-circuit substrate 1 of the first preferred embodiment, permanent magnets 5a are arranged on the side surfaces 2c of the substrate body 2 in the built-in-circuit substrate 1a, and therefore, a thickness t1 of the built-in-circuit substrate 1a is reduced compared with the built-in-circuit substrate 1, and as a result, a reduction in the profile of the built-in-circuit substrate 1a is achieved.

In the built-in-circuit substrate 1a illustrated in FIG. 4, the permanent magnets 5a are arranged on side surfaces 2c other than the side surfaces 2c of the substrate body 2 on which the outer electrodes 4 are located, but, for example, the permanent magnets 5a preferably are arranged on the side surfaces 2c of the substrate body 2 on which the outer electrodes 4 are provided and the permanent magnets 5a may be arranged so as to be in contact with the outer electrodes 4. With this configuration, the external magnetic field is efficiently applied to the Ni layers 4*b* of the outer electrodes 4, and therefore, the degree of freedom in selecting the permanent magnets 5*a* is improved.

In addition, in the present preferred embodiment, the outer electrodes 4 preferably are provided on the other main surface 2*b* of the substrate body 2.

Third Preferred Embodiment

Figure 5:
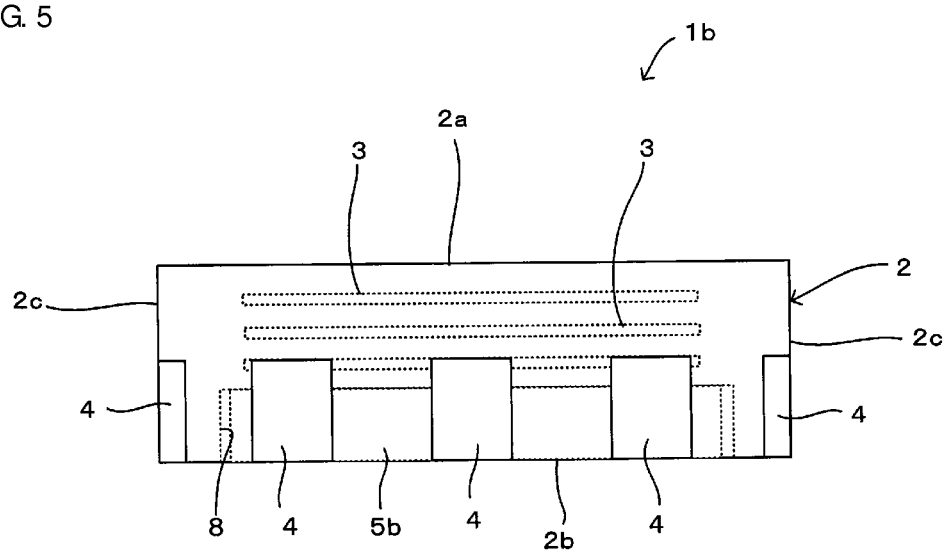
FIG. 5 is a front view of a built-in-circuit substrate according to a third preferred embodiment of the present invention.
Figure 6:
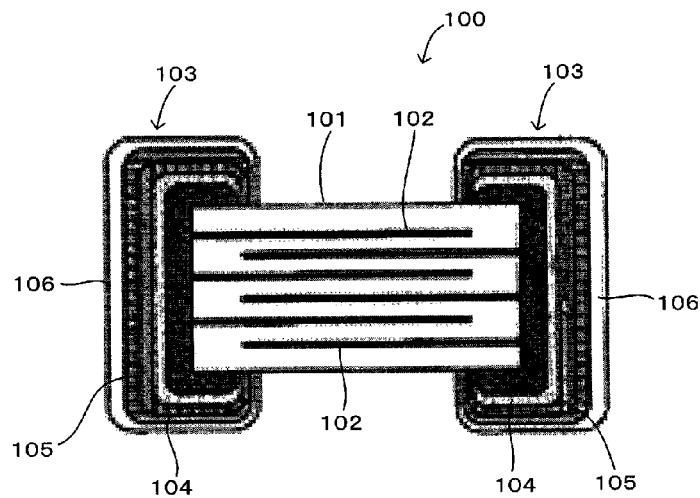
FIG. 6 is a longitudinal sectional view of a ceramic electronic component of the related art.
Figure 7:
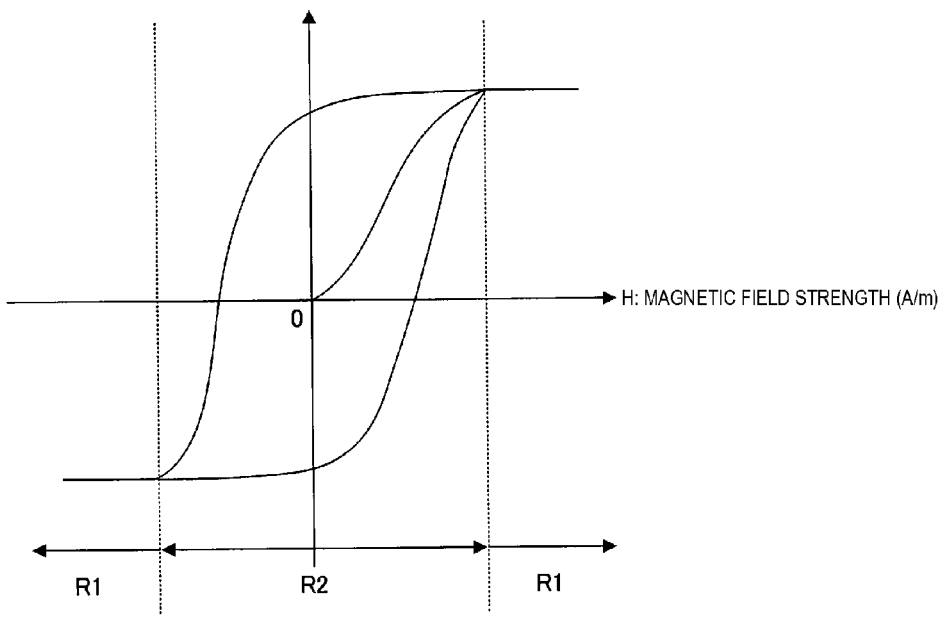
FIG. 7 illustrates a B-H characteristic of a Ni layer.

A built-in-circuit substrate 1*b* according to a third preferred embodiment of the present invention is described with reference to FIG. 5. FIG. 5 is a front view of the built-in-circuit substrate 1*b*.

The built-in-circuit substrate 1*b* according to this preferred embodiment differs from the built-in-circuit substrate 1 of the first preferred embodiment described with reference to FIG. 1 in that a concavity 8 is provided in the other main surface 2*b* of the substrate body 2 and a permanent magnet 5*b* is arranged in the concavity 8, as illustrated in FIG. 5. The rest of the configurations are preferably the same as those of the built-in-circuit substrate 1 of the first preferred embodiment, and therefore, the same symbols are used and description thereof is omitted.

By arranging the permanent magnet 5*b* in the concavity 8 provided in the substrate body 2 in this way, a reduction in the profile of the built-in-circuit substrate 1*b* is achieved and the size (area in a plan view) of the built-in-circuit substrate 1*b* is significantly reduced. The place where the permanent magnet 5*b* is to be located is not limited to the other main surface 2*b* of the substrate body 2, and the permanent magnet 5*b* may be arranged in a concavity formed in the one main surface 2*a* or in a side surface 2*c*.

The present invention is not limited to the above-described preferred embodiments and can be modified in various ways not described above so long as they do not depart from the gist of the present invention.

For example, a composite module may be formed by mounting the electronic components 7 on one main surface (one main surface 2*a* of substrate body 2) of the above-described built-in-circuit substrate 1*a* or 1*b* of the second or third preferred embodiment.

In addition, in the composite module 6 illustrated in FIG. 3, a configuration may be adopted in which a concavity having a square annular shape in a plan view is provided in the one main surface 2*a* of the substrate body 2 and the permanent magnet 5 is arranged in the concavity, similarly to as in the built-in-circuit substrate 1*b* of the third preferred embodiment.

In addition, the permanent magnets 5, 5*a* and 5*b* arranged on the substrate body 2 are not limited to being arranged at a single position, and for example, may be arranged on both the one main surface 2*a* and the side surfaces 2*c* of the substrate body 2, and a plurality of permanent magnets 5, 5*a* and 5*b* may be arranged on the same surface of the substrate body 2.

Preferred embodiments of the present invention are applicable to any type of built-in-circuit substrate in which RF signals are used and inner electrodes 3 or outer electrodes 4 of a substrate body 2 include a Ni layer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A built-in-circuit substrate comprising:
   a substrate body;
   an electrical circuit including an inner electrode provided inside the substrate body and configured to receive an RF signal;
   an outer electrode provided on the substrate body so as to be connected to the electrical circuit and including an underlying metal layer and a nickel layer covering at least a portion of the underlying metal layer; and
   a magnet which is arranged on the substrate body; wherein
   the outer electrode is exposed outside the substrate body; and
   the built-in circuit substrate includes no gaps inside the substrate body.

2. The built-in-circuit substrate according to claim 1, wherein the magnet directly contacts a portion of the substrate body in which the inner electrode is provided.

3. The built-in-circuit substrate according to claim 1, wherein the magnet is located adjacent to or in a vicinity of the outer electrode.

4. The built-in-circuit substrate according to claim 1, wherein the magnet is arranged on one main surface or another main surface of the substrate body.

5. The built-in-circuit substrate according to claim 4, wherein a concavity is provided on the one main surface or the other main surface of the substrate body, and the magnet is located in the concavity.

6. A composite module comprising:
   the built-in-circuit substrate according to claim 4; and
   an electronic component mounted on the one main surface of the substrate body; wherein
   the magnet is arranged so as to surround the electronic component on a side of the one main surface of the substrate body.

7. The composite module according to claim 6, wherein a concavity is provided on the one main surface or the another main surface of the substrate body, and the magnet is located in the concavity.

8. The composite module according to claim 6, wherein the electrical circuit is a filter circuit.

9. A composite module comprising:
   the built-in-circuit substrate according to claim 1; and
   an electronic component mounted on one main surface of the substrate body.

10. The composite module according to claim 9, wherein the magnet is arranged on the one main surface or another main surface of the substrate body.

11. The composite module according to claim 10, wherein a concavity is provided on the one main surface or the another main surface of the substrate body, and the magnet is located in the concavity.

12. The composite module according to claim 9, wherein the magnet is arranged on a side surface of the substrate body which is not the one main surface or another main surface of the substrate body.

13. The composite module according to claim 9, wherein the electrical circuit is a filter circuit.

14. The composite module according to claim 9, wherein the magnet is located adjacent to or in an area of the outer electrode.

15. The built-in-circuit substrate according to claim 1, wherein the magnet is arranged on a side surface of the substrate body which is not a main surface of the substrate body.

16. The built-in-circuit substrate according to claim 15, wherein the magnet does not overlap with the inner electrode in a plan view.

17. The built-in-circuit substrate according to claim 1, wherein the electrical circuit is a filter circuit.

18. An electronic appliance comprising the built-in circuit substrate according to claim 1.

19. The electronic appliance according to claim 18, wherein the electronic appliance is a cellular phone.

* * * * *